US011006551B2

(12) United States Patent
Bailey et al.

(10) Patent No.: US 11,006,551 B2
(45) Date of Patent: May 11, 2021

(54) METHOD FOR RE-DIRECTION OF AIRFLOW FROM AIR HANDLER SYSTEM(S) INTEGRATED INTO A MODULAR DATA CENTER

(71) Applicant: DELL PRODUCTS, L.P., Round Rock, TX (US)

(72) Inventors: Mark M. Bailey, Round Rock, TX (US); Trey S. Wiederhold, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/557,801

(22) Filed: Aug. 30, 2019

(65) Prior Publication Data

US 2021/0068306 A1   Mar. 4, 2021

(51) Int. Cl.
*H05K 7/20* (2006.01)

(52) U.S. Cl.
CPC ..... *H05K 7/20745* (2013.01); *H05K 7/20836* (2013.01)

(58) Field of Classification Search
CPC ........... H05K 7/20745; H05K 7/20836; H05K 7/20781; H05K 7/2079; H05K 7/20736; H05K 7/20827; H05K 7/20809; H05K 7/20754; H05K 7/1497; H05K 7/1488; H01L 23/34
See application file for complete search history.

(56) References Cited

U.S. PATENT DOCUMENTS

| | | | |
|---|---|---|---|
| 7,852,627 B2 | 12/2010 | Schmitt et al. | |
| 9,155,229 B2 | 10/2015 | Schmitt et al. | |
| 10,165,710 B1* | 12/2018 | Pompei | H05K 7/20745 |
| 2007/0135032 A1* | 6/2007 | Wang | H05K 7/20745 454/184 |
| 2009/0210096 A1* | 8/2009 | Stack | F24F 11/30 700/278 |
| 2012/0171943 A1* | 7/2012 | Dunnavant | F28D 15/02 454/184 |
| 2013/0062047 A1* | 3/2013 | Vaney | H05K 7/20745 165/287 |
| 2014/0069127 A1* | 3/2014 | Bailey | H05K 7/20836 62/96 |
| 2016/0050788 A1 | 2/2016 | Leizgold et al. | |
| 2019/0335623 A1* | 10/2019 | Gao | H05K 7/20 |

\* cited by examiner

*Primary Examiner* — Adam B Dravininkas
(74) *Attorney, Agent, or Firm* — Isidore PLLC

(57) ABSTRACT

A modular data center (MDC) includes an air handling system having air handling unit(s) (AHU(s)) with return air inlet and supply air outlet that are vertically spaced. An air redirection structure includes a return air plenum that is in fluid communication with and vertically aligned to the return air inlet of the AHU(s). The return air plenum directs return air from a return air opening of the first air redirection structure to the AHU(s). The return air opening is positioned adjacent to a hot aisle of a volumetric container of the MDC. A supply air plenum is in fluid communication with and vertically aligned to the supply air outlet of the AHU(s). The supply air plenum directs supply air from the AHU(s) to a supply air opening of the first air redirection structure. The supply air opening is positioned to provide supply air to the cold aisle of the container.

19 Claims, 16 Drawing Sheets

METHOD FOR RE-DIRECTION OF AIRFLOW FROM AIR HANDLER SYSTEM(S) INTEGRATED INTO A MODULAR DATA CENTER

BACKGROUND

1. Technical Field

The present disclosure relates in general to air handling within a modular data center (MDC), and more particularly to air handling within an MDC arranged with hot and cold aisles.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A data center house IHSs and associated components, such as telecommunications and storage systems. A modular data center (MDC) system is a deployable data center. A MDC can be placed anywhere data capacity is needed. MDC systems consist of purpose-engineered modules and components that offer scalable data center capacity with multiple power and cooling options. Modular edge data centers (MEDCs) are generally smaller MDC facilities that extend the edge of the network to deliver cloud computing resources and cached streaming content to local end users. An effective use of space in a MEDC involves arranging an array of information technology (IT) racks in a straight line between hot and cold aisles. This arrangement allows for concurrent removal of racks and allows service from both hot and cold aisles MEDCs are generally designed to ship over land transportation routes. The straight longitudinal line arrangement of IT racks in an MEDC makes the MEDC suitable for lateral road width restrictions.

MEDCs are cooled using air handling units (AHUs). Using wall-mounted AHUs rather than top-mounted AHUs typically provides the lowest installed cost. Wall mounting the AHUs along the exterior wall adjacent to the cold aisle before travel would cause the shipping MEDC to exceed the lateral road width limits. Alternatively, rearranging the MEDC layout to accommodate side-mounted AHUs compromises the optimized straight longitudinal line of IT racks between hot and cold aisles. Wall mounting of the AHUs after shipping the MEDC results in higher overall deployment costs.

BRIEF SUMMARY

In accordance with the teachings of the present disclosure, an air handling system includes at least one air handling unit (AHU) having a return air inlet and a supply air outlet that are vertically spaced. The air handling system includes a first air redirection structure having a return air plenum and a supply air plenum. The return air plenum is in fluid communication with and vertically aligned to the return air inlet of the at least one AHU. The return air plenum directs return air from a return air opening of the first air redirection structure to the return air inlet of the at least one AHU. The return air opening is positioned adjacent to a hot aisle of a volumetric container configured to house at least one heat generating information technology (IT) component. The supply air plenum is in fluid communication with and vertically aligned to the supply air outlet of the at least one AHU. The supply air plenum directs supply air from the supply air outlet of the at least one AHU to a supply air opening of the first air redirection structure. The supply air opening is positioned to provide supply air to a cold aisle of the volumetric container.

In accordance with the teachings of the present disclosure, a modular data center (MDC) includes a volumetric container. The volumetric container includes an enclosure having first and second exterior walls at a forward and an aft end, connected by lateral exterior walls. At least one heat generating IT component is positioned longitudinally within the volumetric container. The at least one heat generating IT component is positioned between a cold aisle and a hot aisle running longitudinally along respective left and right interior sides of the volumetric container. An air handling system of the MDC includes at least one AHU having a return air inlet and a supply air outlet that are vertically spaced. The air handling system includes a first air redirection structure having a return air plenum and a supply air plenum. The return air plenum is in fluid communication with and vertically aligned to the return air inlet of the at least one AHU. The return air plenum directs return air from a return air opening of the first air redirection structure to the return air inlet of the at least one AHU. The return air opening is positioned adjacent to the hot aisle of the volumetric container. The supply air plenum is in fluid communication with and vertically aligned to the supply air outlet of the at least one AHU. The supply air plenum directs supply air from the supply air outlet of the at least one AHU to a supply air opening of the first air redirection structure. The supply air opening is positioned to provide supply air to the cold aisle of the volumetric container.

In accordance with the teachings of the present disclosure, a method is provided for installing an air handling system for a MDC configured as a volumetric container with at least one heat generating IT component placed between a cold aisle and a hot aisle extending longitudinally within the MDC. In one or more embodiments, the method includes positioning a first air redirection structure transverse to both cold and hot aisles of the volumetric container at a selected one of a forward and an aft end of the volumetric container. The first air redirection structure has: (i) a return air plenum, including a return air opening positioned adjacent to the hot aisle; and (ii) a supply air plenum, including a supply air opening positioned adjacent to the cold aisle. The method includes positioning at least one AHU adjacent to the first air redirection structure. The at least one AHU has a return air inlet and a supply air outlet that are vertically arranged. The return air inlet is positioned in vertical alignment and in correspondence with the return air plenum. The supply air outlet is positioned in vertical alignment and in correspondence with the supply air plenum. The method includes coupling the return air inlet for fluid communication with the return air plenum to direct the return air from the return air opening laterally to the return air inlet of the at least one AHU. The method includes coupling the supply air outlet for fluid communication with the supply air plenum to direct the supply air from the supply air outlet of the at least one AHU laterally to the supply air opening.

In accordance with the teachings of the present disclosure, a method is disclosed for providing a supply of cooling airflow to heat generating IT components within a mobile MDC having multiple cooling zones. The IT components are placed between a cold aisle and a hot aisle extending longitudinally within the MDC. The method includes receiving respective environmental values from two or more environmental sensors longitudinally spaced in respective cooling zones in the MDC. The method includes determining, based on the respective environmental values, respective cooling requirements for each zone within the IT compartment. The method includes controlling an on/off state and rate of cooling air flow for selected AHUs from among one or more front AHUs and one or more aft AHUs to provide cooling air to the multiple cooling zones within the IT compartment, based on the respective cooling requirements for each zone.

The above presents a general summary of several aspects of the disclosure to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to aspects of the present disclosure, an air handling system, a modular data center (MDC) that includes the air handling system, and methods of installing and controlling the air handling system of the MDC are provided. The present disclosure enables economical assembly and road transport of the MDC. The air handling system has air handling unit(s) (AHU(s)) with return air inlet and supply air outlet that are vertically spaced. An air redirection structure of the air handling system includes a return air plenum that is in fluid communication with and vertically aligned to the return air inlet of the AHU(s). The return air plenum directs return air from a return air opening of the first air redirection structure to the return air inlet of the AHU(s).

The return air opening is positioned adjacent to a hot aisle of the volumetric container. A supply air plenum is in fluid communication with and vertically aligned to the supply air outlet of the AHU(s). The supply air plenum directs supply air from the supply air outlet of the AHU(s) to a supply air opening of the first air redirection structure. The supply air opening is positioned to provide supply air to the cold aisle of the volumetric container.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
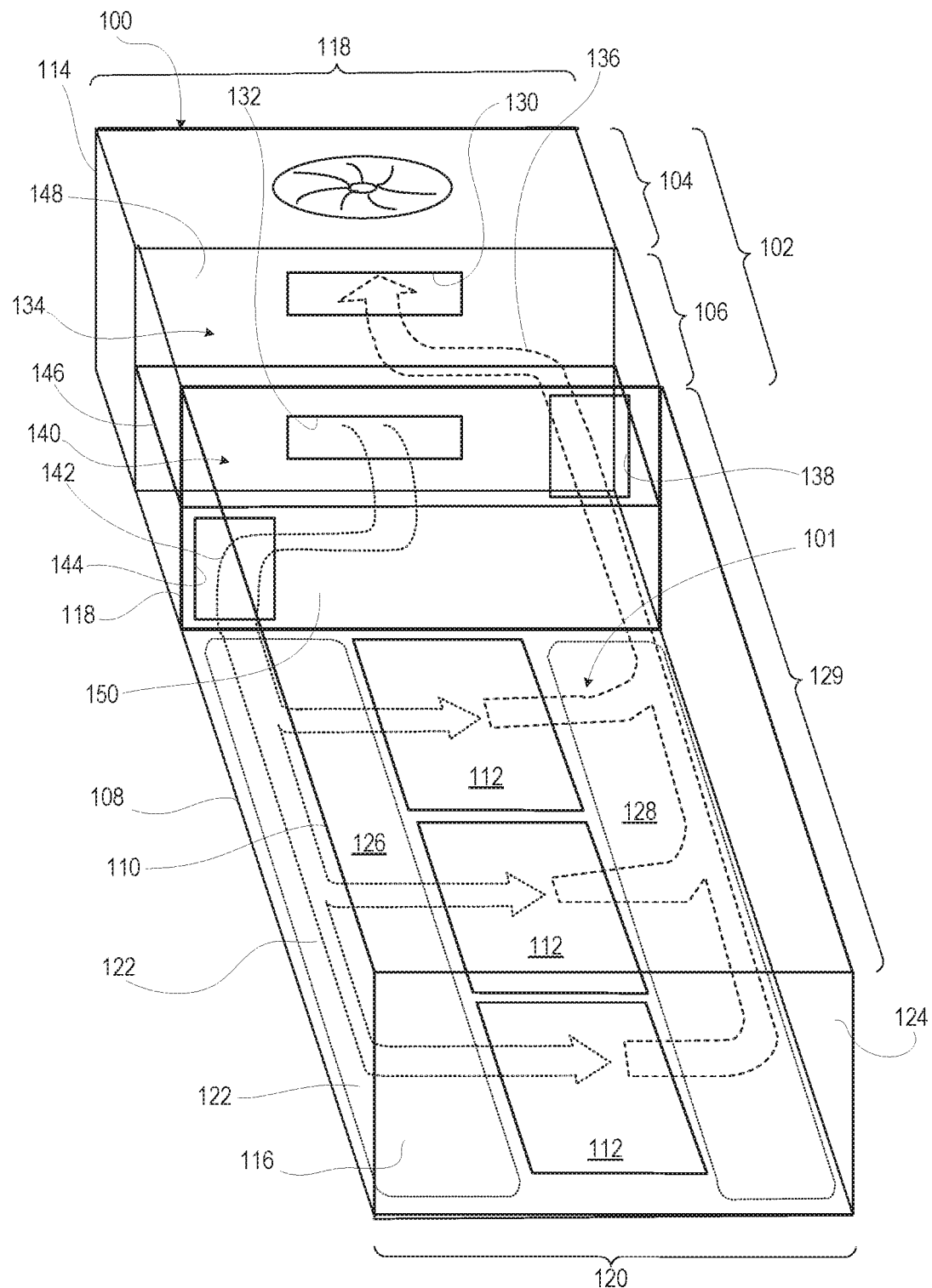
FIG. 1 is a block diagram of a modular data center (MDC) having a forward-mounted or aft-mounted air handling unit (AHU) with vertically-spaced cold air outlet and hot air inlet, according to one or more embodiments.

FIG. 1 depicts modular data center (MDC) 100 having air cooling circulation pattern 101 provided by air handling system 102. Air handling system 102 has forward-mounted or aft-mounted air handling unit (AHU) 104 with vertically-spaced cold supply air outlet 132 and hot return air inlet 130. MDC 100 has air handling system 102 that includes AHU 104 and air redirection structure 106. MDC 100 includes volumetric container 108 having enclosure 110 that encloses heat generating IT components 112, such as rack-mounted information handling systems (IHSs). IT components 112 are cooled by air handling system 102. Enclosure 110 of volumetric container 108 includes first (forward) and second (aft) exterior walls 114, 116 at forward and aft ends 118, 120, respectively, that are connected by left and right lateral exterior walls 122, 124. IT components 112 are positioned longitudinally within enclosure 110 of volumetric container 108 between cold aisle 126 and hot aisle 128, which run longitudinally along respective left and right interior sides (relative to a forward end location of AHU 104) of volumetric container 108.

For clarity, enclosure 110 of volumetric container 108 provides IT compartment 129 that houses IT components 112 extending from the forward end 118 to the aft end 120 of enclosure 110. Cold aisle 126 extends adjacent to left lateral exterior wall 122. Hot aisle 128 extends adjacent to right lateral exterior wall 124. Air handling system 102 is positioned at the forward end 118 of enclosure 110. In one or more alternate embodiments, air handling system 102 is positioned at aft end 120 instead of forward end 112. Also, in one or more alternate embodiments, cold aisle 126 can extended adjacent to right lateral exterior wall 124 and hot aisle 128 can extend adjacent to left lateral exterior wall 122, rather than the reverse. In one or more embodiments, volumetric container 108 can be interchangeably placed on a road transport trailer (not shown) to be moved. AHU 104 is depicted at forward end 118 when transported in this orientation. AHU 104 can also be at aft end 120 (not shown) when volumetric container 108 is placed in the opposite orientation. In one or more embodiments, MDC 100 is transported with or without IT components 110. When shipped with IT components 110, IT components 110 can be locally powered and/or networked or operably coupled to power and telecommunication subsystems available at a deployed location. In the provided embodiments, MDC 100 can include additional power and telecommunication components to support operation while MDC is being transported, as the configuration allows for attachment and use of the air handling units without making the combined unit too wide for over the ground transportation. In one or more embodiments, aspects of the present innovation are incorporated into data centers that are not modular or mobile.

AHU 104 of air handling system 102 has return air inlet 130 and supply air outlet 132 that are vertically spaced relative to each other. Air redirection structure 106 of air handling system 102 includes return air plenum 134 that is in fluid communication with and vertically aligned to return air inlet 130 of AHU 104. Return air plenum 134 directs return air 136 from return air opening 138 of air redirection structure 106 to return air inlet 130 of AHU 104. Return air opening 138 is positioned adjacent to hot aisle 128 of volumetric container 108. Air redirection structure 106 of air handling system 102 includes supply air plenum 140 that is in fluid communication with and vertically aligned to supply air outlet 132 of AHU 104. Supply air plenum 140 directs supply air 142 from supply air outlet 132 of AHU 104 to supply air opening 144. Supply air opening 144 is positioned to provide supply air 142 to cold aisle 126 of volumetric container 108.

In the illustrated embodiments, return air inlet 130 of AHU 104 is above supply air outlet 132. Also, return air plenum 134 is above supply air plenum 140 and separated from supply air plenum 140 by a horizontal partition 146. In one or more embodiments, the reversed or opposite vertical positions of return air plenum 134 and supply air plenum 140 can be used.

In one or more embodiments, air redirection structure 106 includes first vertical panel 148 that has respective, vertically-spaced interface apertures (not shown) that align with return air inlet 130 and supply air outlet 132 of AHU 104. Air redirection structure 106 includes second vertical panel 150 that includes return air opening 138 and supply air opening 144. Horizontal partition 146 is attached between first and second vertical panels 148, 150 separating return air plenum 134 from supply air plenum 140. First vertical panel 148 is located adjacent AHU 104 and second vertical panel 150 is opposite to first vertical panel 148 and located adjacent to volumetric container 108. Horizontal partition 146 sealably separates return air inlet 130 and return air opening 138 from supply air outlet 132 and supply air opening 144. Horizontal partition 146 is air-tight, preventing exchange of supply air flow and return air flow within respective air plenums (134, 140).

In one or more embodiments, neither of return air inlet 130 and supply air outlet 132 is aligned with the corresponding one of the return air opening 138 and the supply air opening 144, and air redirection structure 106 laterally redirects both return air 136 and supply air 142. In one or more embodiments, one of the return air inlet 130 and supply air outlet 132 is aligned with its corresponding one of the return air opening 138 and the supply air opening 144. The other one of the return air inlet 130 and supply air outlet 132 is not aligned with the corresponding one of the return air opening 138 and the supply air opening 144. In these embodiments, air redirection structure 106 provides lateral redirection for the corresponding one but not the other of the return air 136 and supply air 142 to mitigate the non-alignment. The redirection allows positioning of one or more vertically-arranged AHUs 104 in an upright position at a narrower end of MDC 100, enabling land transportation via roads.

Figure 2:
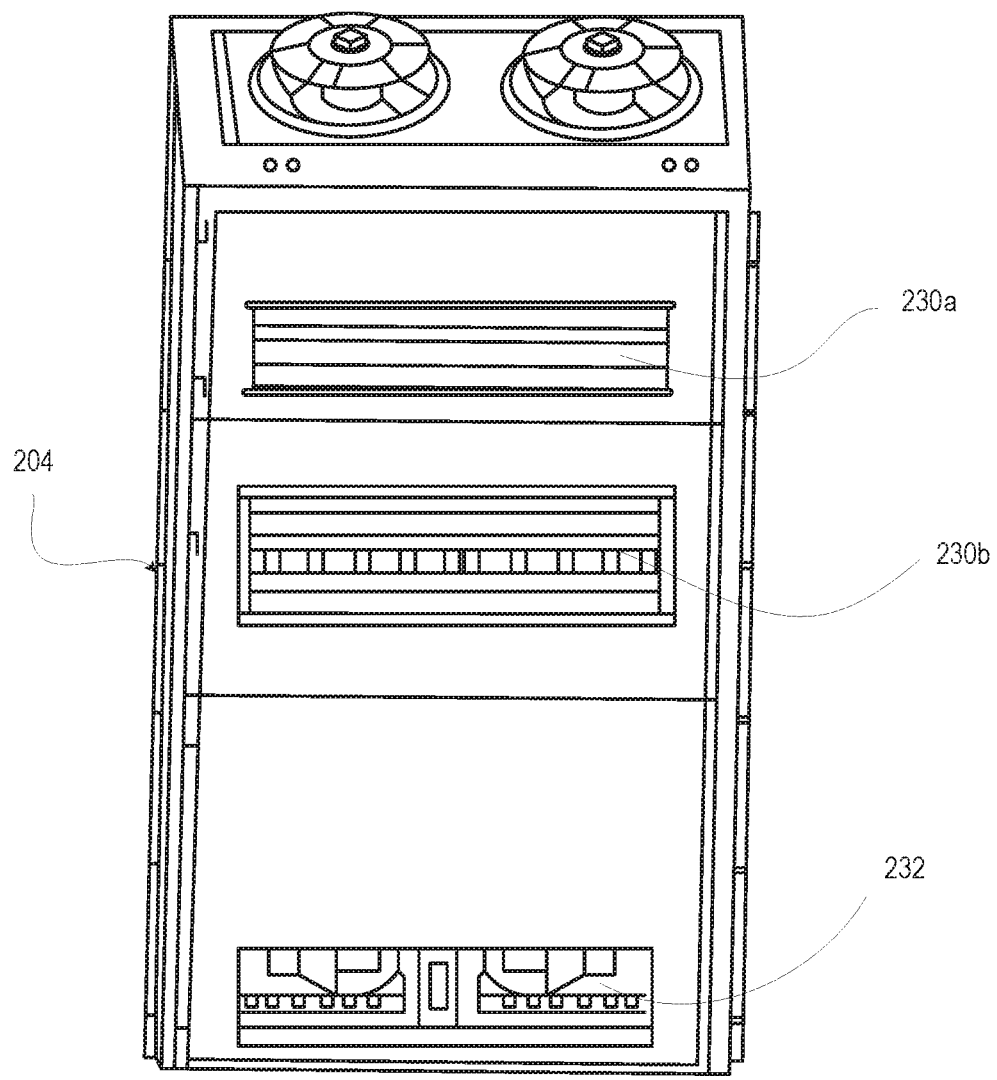
FIG. 2 is a front view of an example AHU with vertically-spaced cold air outlet and hot air inlet, according to one or more embodiments.

FIG. 2 depicts example AHU 204 with vertically-spaced cold supply air outlet 232 and stacked hot return air inlets 230a, 230b. AHU 204 has dual stacked return air inlets 230a, 230b that are used for different cooling modes (e.g., closed loop (recycled air), open loop (venting), mixed mode (partially recycled and partially exhausted). Supply air outlet 232 is vertically spaced below return air inlets 230a, 230b.

Figure 3:
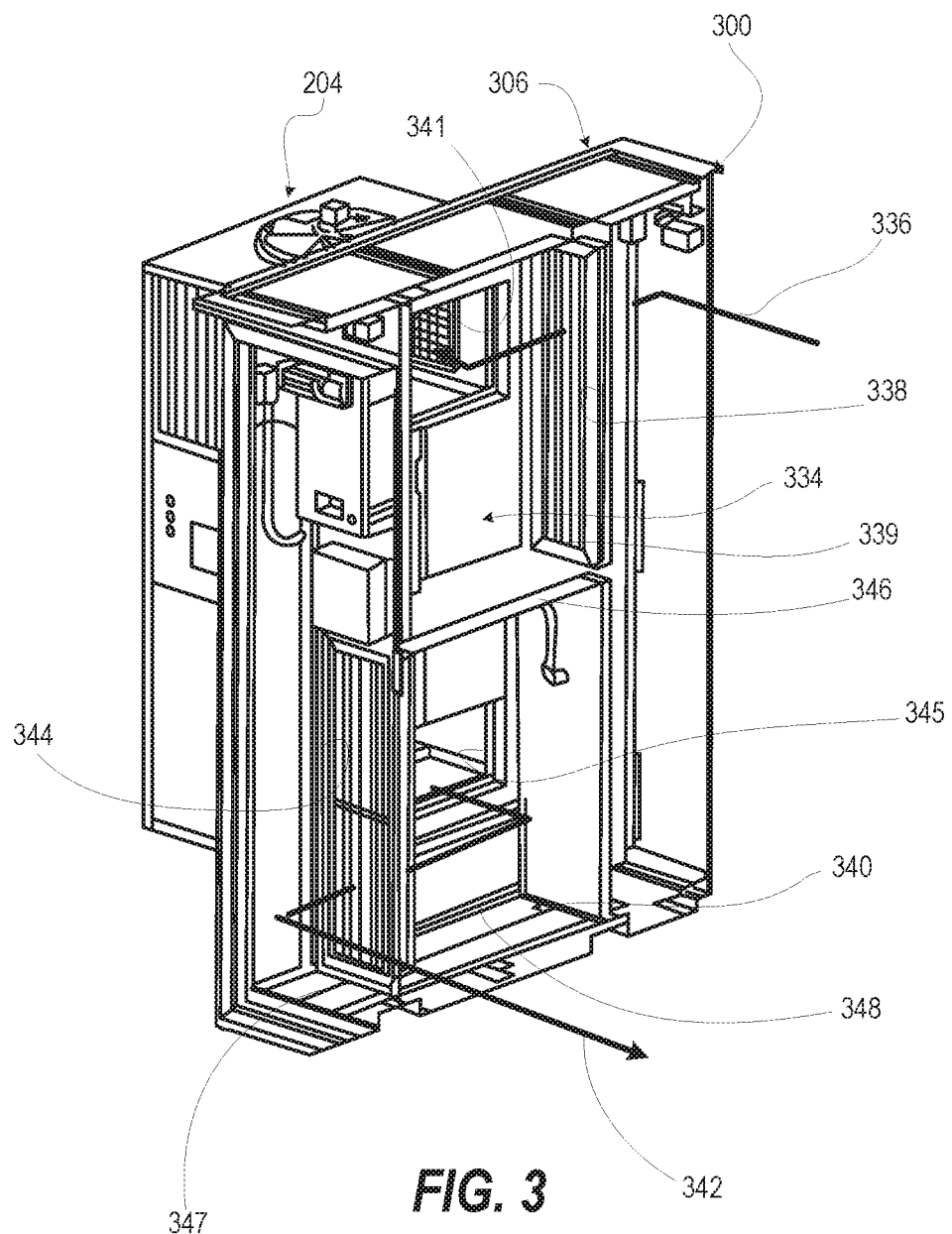
FIG. 3 is an isometric view of a single-rack modular edge data center (MEDC) having an air handling system with one AHU and an example air redirection structure, according to one or more embodiments.

FIG. 3 depicts single-rack modular edge data center (MEDC) 300 with example air redirection structure 306. MEDC 300 has single rack-mounted IT component 312 within volumetric container 308. Air handling system 302 includes AHU 204 that is positioned external to enclosure 310 of volumetric container 308. Left door (not shown) is removed from enclosure 310 to expose air redirection structure 306. Air redirection structure 306 facilitates exchange of cooling air between single AHU 204 and IT compartment of MEDC 300. IT compartment 329 is an opposite side of volumetric container 308 from air handling system 302. IT compartment 329 includes rack-mounted IT component 312.

Figure 4:
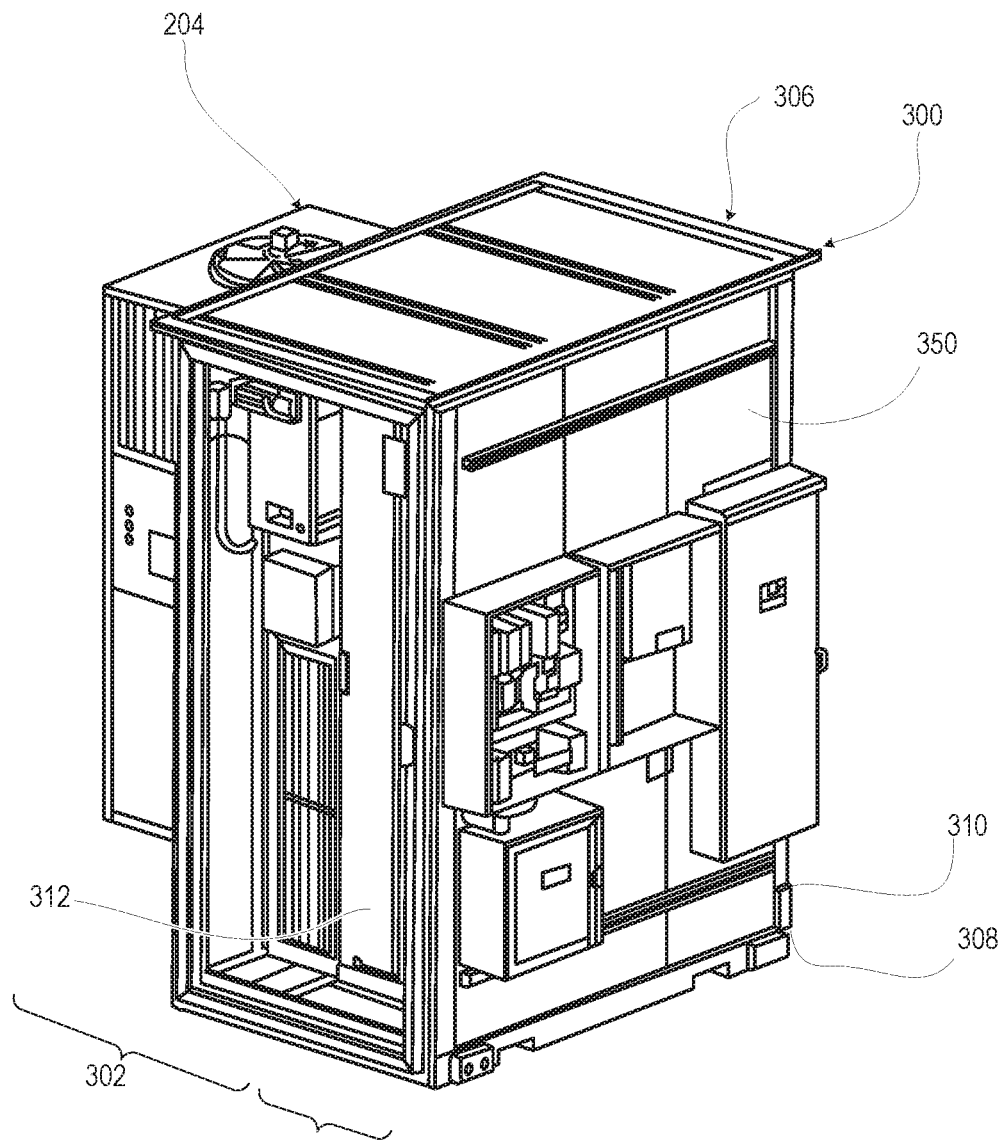
FIG. 4 is an isometric cutaway view of MEDC, with the example air redirection structure utilized/provisioned in FIG. 3, having return and supply air plenums, according to one or more embodiments.

FIG. 4 depicts MEDC 300 with IT compartment 329 and the adjacent portion of air redirection structure 306 cutaway. Air redirection structure 306 includes upper return air plenum 334 separated by horizontal partition 346 from lower supply air plenum 340. Return air plenum 334 begins at return air opening 338, which includes return air louver 339. Return air 336 is directed to return air inlet interface aperture 341 provided in first vertical panel 348 that is oriented proximate to AHU 204. Supply air plenum 340 receives cooling air 342 from AHU 204 through supply air outlet interface aperture 345 provided in first vertical panel 348. Supply air plenum 340 directs cooling air 342 laterally through supply air louver 347.

Figure 5:
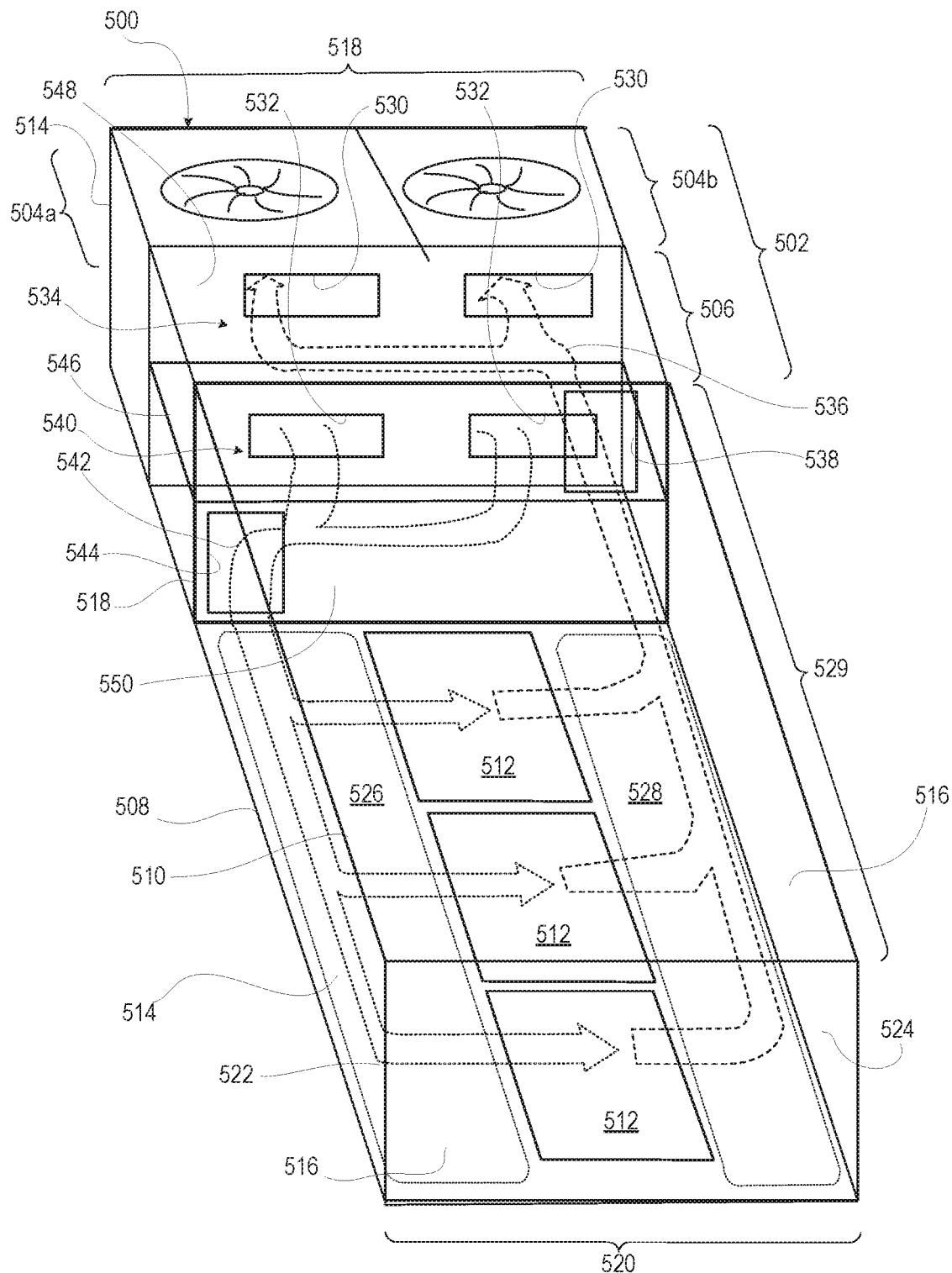
FIG. 5 is a diagram of a MDC having two forward-mounted or aft-mounted AHUs, routing air through the volumetric container via an air redirection structure, according to one or more embodiments.

FIG. 5 depicts MDC 500 having two forward-mounted or aft-mounted AHUs 504a, 504b routing air through volumetric container 508 via air redirection structure 506. MDC 500 has dual-AHU air handling system 502, which includes first AHU 504a, second AHU 504b, and air redirection structure 506. MDC 500 includes volumetric container 508 having enclosure 510 that encloses heat generating IT components 512, such as rack-mounted information handling systems. IT components 512 are cooled by air handling system 502. Enclosure 510 of volumetric container 508 includes first (forward) and second (aft) exterior walls 514, 516 at forward and aft ends 518, 520, respectively, that are connected by left and right lateral exterior walls 522, 524. IT components 512 are positioned longitudinally within volumetric container 508 between cold aisle 526 and hot aisle 528 running longitudinally along respective left and right interior sides of volumetric container 508.

Each AHU 504a, 504b of air handling system 502 has return air inlet 530 and supply air outlet 532 that are vertically spaced from each other. Air redirection structure 506 of air handling system 502 includes return air plenum 534 that is in fluid communication with and vertically aligned to return air inlet 530 of AHU 504. Return air plenum 534 directs return air 536 from return air opening 538 of air redirection structure 506 to return air inlet 530 of AHU 504. Return air opening 538 is positioned adjacent to hot aisle 528 of volumetric container 508. Air redirection structure 506 of air handling system 502 includes supply air plenum 540 that is in fluid communication with and vertically aligned to supply air outlet 532 of AHU 504. Supply air plenum 540 directs supply air 542 from supply air outlet 532 of AHU 504 to supply air opening 544 of air redirection structure 506. Supply air opening 544 is positioned to provide supply air 542 to cold aisle 526 of volumetric container 508. As utilized herein, fluid communication between two components means that the body of circulating air (representing the fluid) moves from one component to the other.

In one or more embodiments, air redirection structure 506 includes first vertical panel 548 that has respective interface apertures (not shown) that vertically align with return air inlet 530 and supply air outlet 532, respectively, of each AHU 504a, 504b. Air redirection structure 506 includes second vertical panel 550 that includes return air opening 538 and supply air opening 544. Horizontal partition 546 is attached between first and second vertical panels 548, 550 separating return air plenum 534 from supply air plenum 540. Horizontal partition 546 is air-tight, preventing exchange of supply air flow and return air flow within respective air plenums (534, 540).

Figure 6:
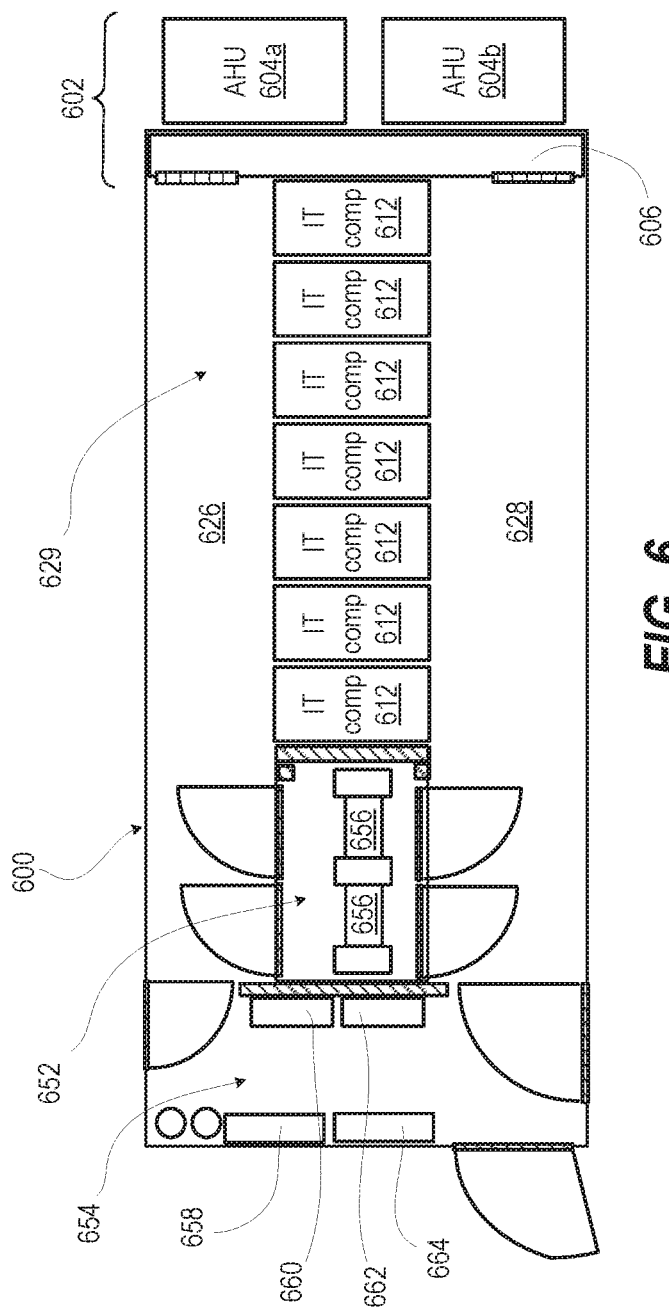
FIG. 6 is a top view of an example MDC having two forward-mounted or aft-mounted AHUs providing cooling to an information technology (IT) compartment and a meet-me compartment within an MDC, according to one or more embodiments.

FIG. 6 is a block diagram depiction of example MDC having two forward-mounted or aft-mounted AHUs 604a, 604b providing cooling to example modular edge data center (MEDC) 600. MEDC 600 is configured with IT compartment 629, meet me compartment 652, and utility room 654. IT compartment 629 includes a longitudinal row of IT components 612 between cold and hot aisles 626, 628. Meet me compartment 652 includes vendor service cabinets 656 for equipment such as network services, telecommunication services, etc. In one or more embodiments, meet me compartment 652 can be accessible to vendors whereas IT compartment 629 can be accessible only by employees that report to an operator of IT components 612. Meet me compartment 652 can also provide an on-site meeting location for personnel. Utility room 654 includes infrastructure support such as power input panel 658, security panel 660, control panel 662, and modular data center interconnect (MDCI) graphical user interface (GUI) console 664. Dual-AHU air handling system 602 of MEDC 600 includes two forward-mounted or aft-mounted AHUs 604a, 604b, with the directional placement of the AHUs being interchangeable in different designs. AHUs 604a, 604b exchange cooling air, via air redirection structure 606, connecting cold and hot aisles 626, 628 with IT compartment 629, meet-me compartment 652, and utility room 654.

Figure 7:
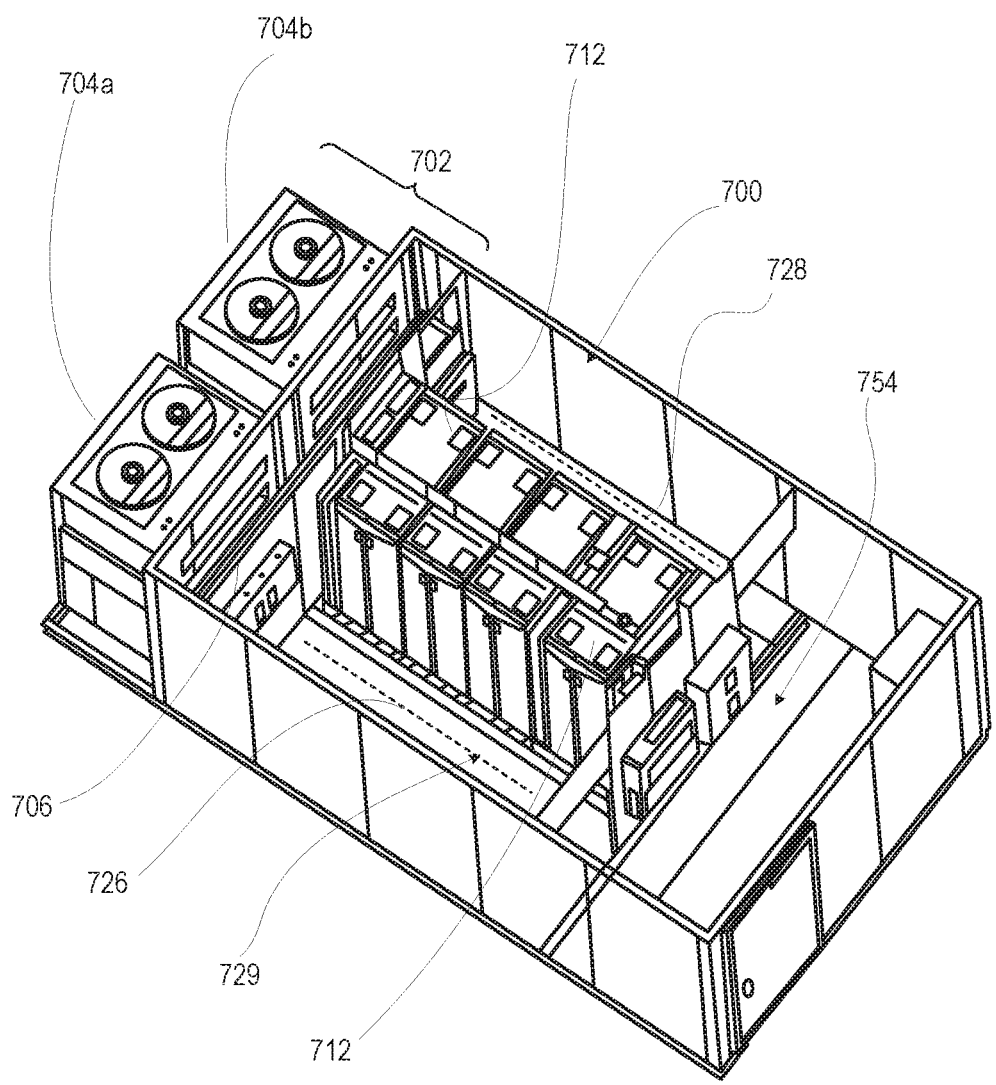
FIG. 7 is a top view of an example MDC having an IT compartment and utility room that are cooled by channeling air from and to external AHUs using an air redirection structure, according to one or more embodiments.

FIG. 7 depicts a three-dimensional, top view of example MEDC 700 that is cooled by channeling air from and to external AHUs 704a, 704b using air redirection structure 706 MEDC 700 has IT compartment 729 and utility room 754. IT compartment 729 includes a longitudinal row of IT components 712 between cold and hot aisles 726, 728. Dual-AHU air handling system 702 of MEDC 700 includes two forward-mounted or aft-mounted AHUs 704a, 704b. AHUs 704a, 704b exchange cooling air via air redirection structure 706 with the IT compartment 729 and utility room 754 via cold and hot aisles 726, 728.

Figure 8:
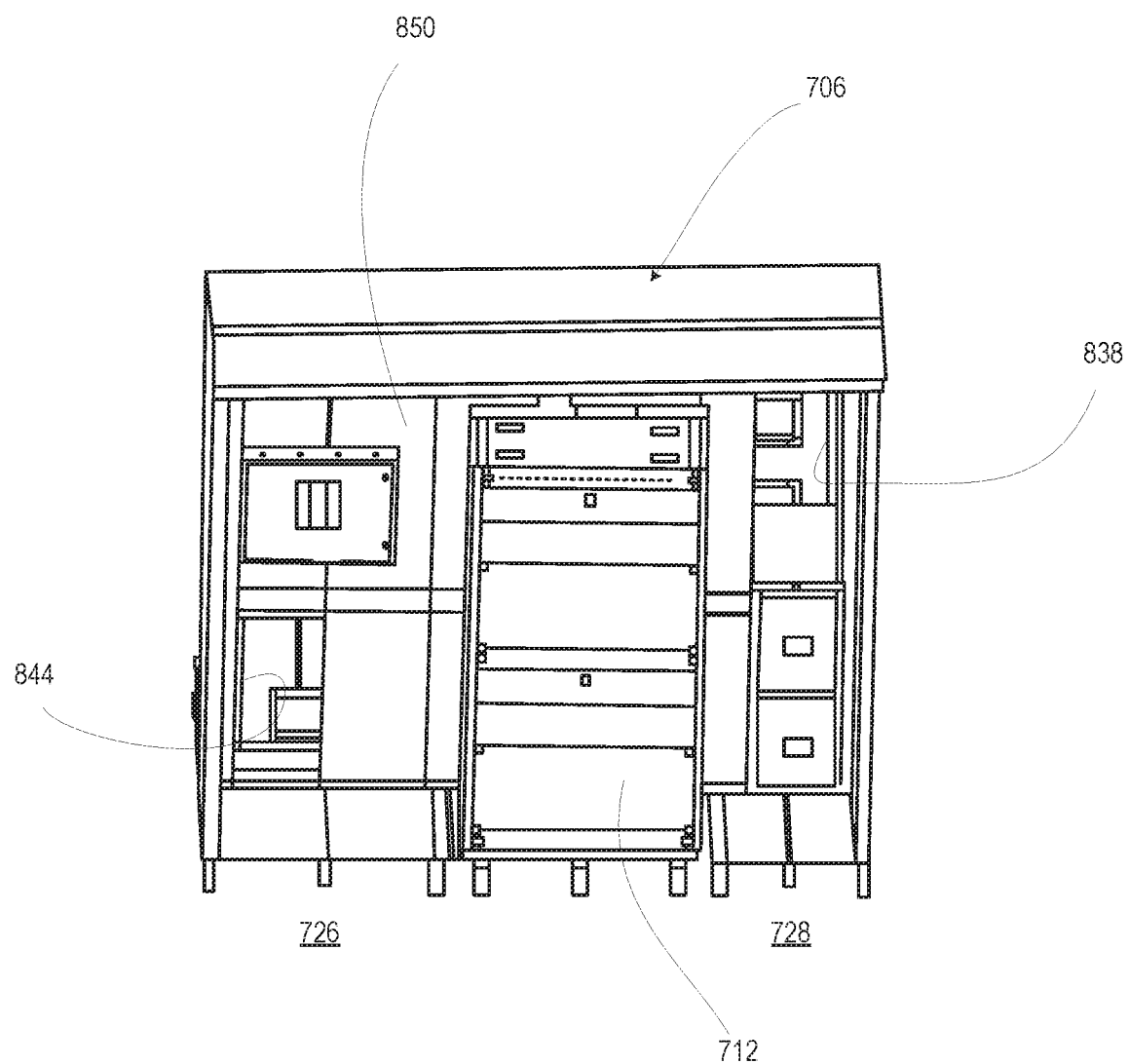
FIG. 8 is a front view of an example air handling system of FIG. 7, according to one or more embodiments.

FIG. 8 provides a view of example air handling system 702 configured to provide air cooling to IT component 712. IT component 712 extends longitudinally away from second vertical panel into the enclosure of MDC. Second vertical panel 850 includes supply air opening 844 that provides cooling air to cold aisle 726 of the enclosure. The cooling air passes through IT component 712 to hot aisle 728 and returns through return air opening 838.

Figure 9:
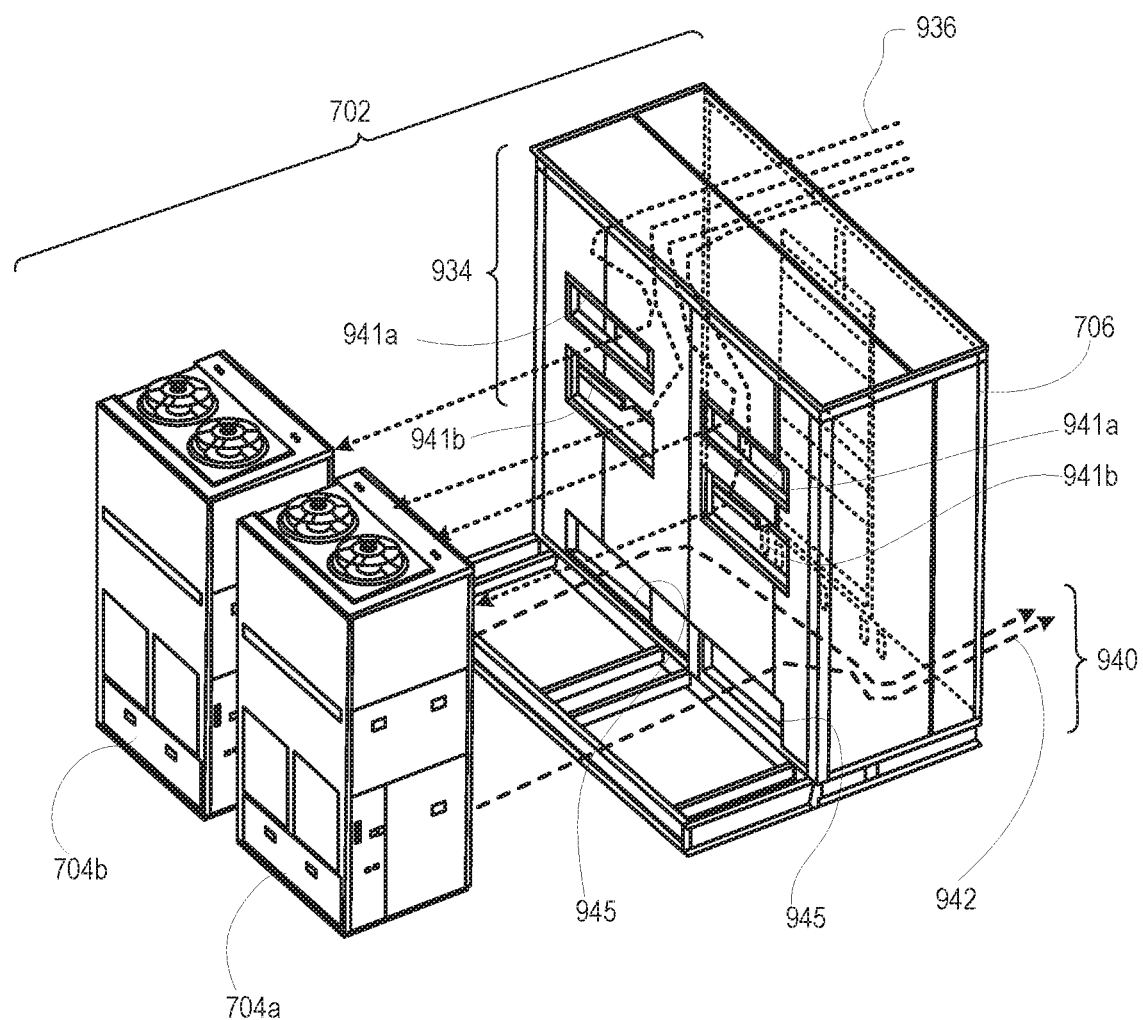
FIG. 9 is a separated view of the two AHUs and the example air redirection structure of FIG. 7, according to one or more embodiments.

FIG. 9 depicts a separated view of dual-AHU air handling system 702, with first and second AHUs 704a, 704b separated from air redirection structure 706. Return air 936 is directed through return air plenum 934 and out of air redirection structure 706 via return air inlet interface apertures 941a, 941b. Return air inlet interface apertures 941a, 941b are in fluid communication with return air intakes (not shown) of AHUs 704a, 704b. After mechanical cooling and/or replacement with ambient air, AHUs 704a, 704b provide supply air 942 via respective supply air outlets (not shown) into supply air outlet interface aperture 945. Supply air plenum 940 receives and directs supply air 942 within air redirection structure 706.

Figure 10:
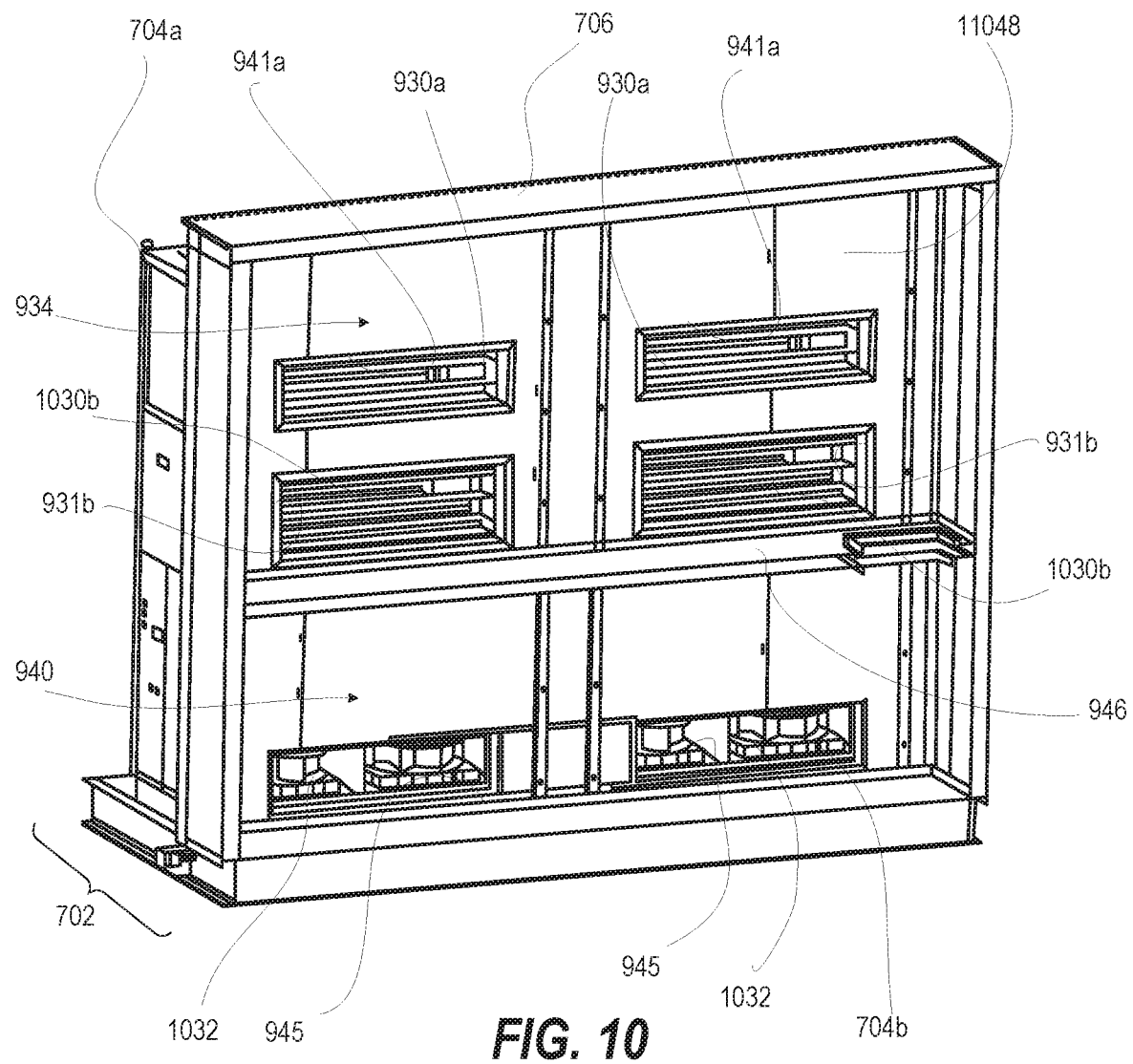
FIG. 10 is a cutaway view of the example air redirection structure of FIG. 7, according to one or more embodiments.

FIG. 10 is an isometric cutaway view of the interior of air redirection structure 706 of dual-AHU air handling system 702 assembled with AHUs 704a, 704b. First vertical panel 1048 is separated into return air plenum 934 and supply air plenum 940 by horizontal partition 1046. Return air inlet interface apertures 941a, 941b in return air plenum 934 provide interface respectively to return air inlets 1030a, 1030b of AHUs 704a, 704b. Each return air inlet interface aperture 941a, 941b is selectively closed by return inlet louver 731 that prevent backflow when one AHU 704a, 704b is not activated or installed. Supply air outlet interface apertures 945 in supply air plenum 940 provide interface to supply air outlets 1032 of AHUs 704a, 704b.

Figure 11:
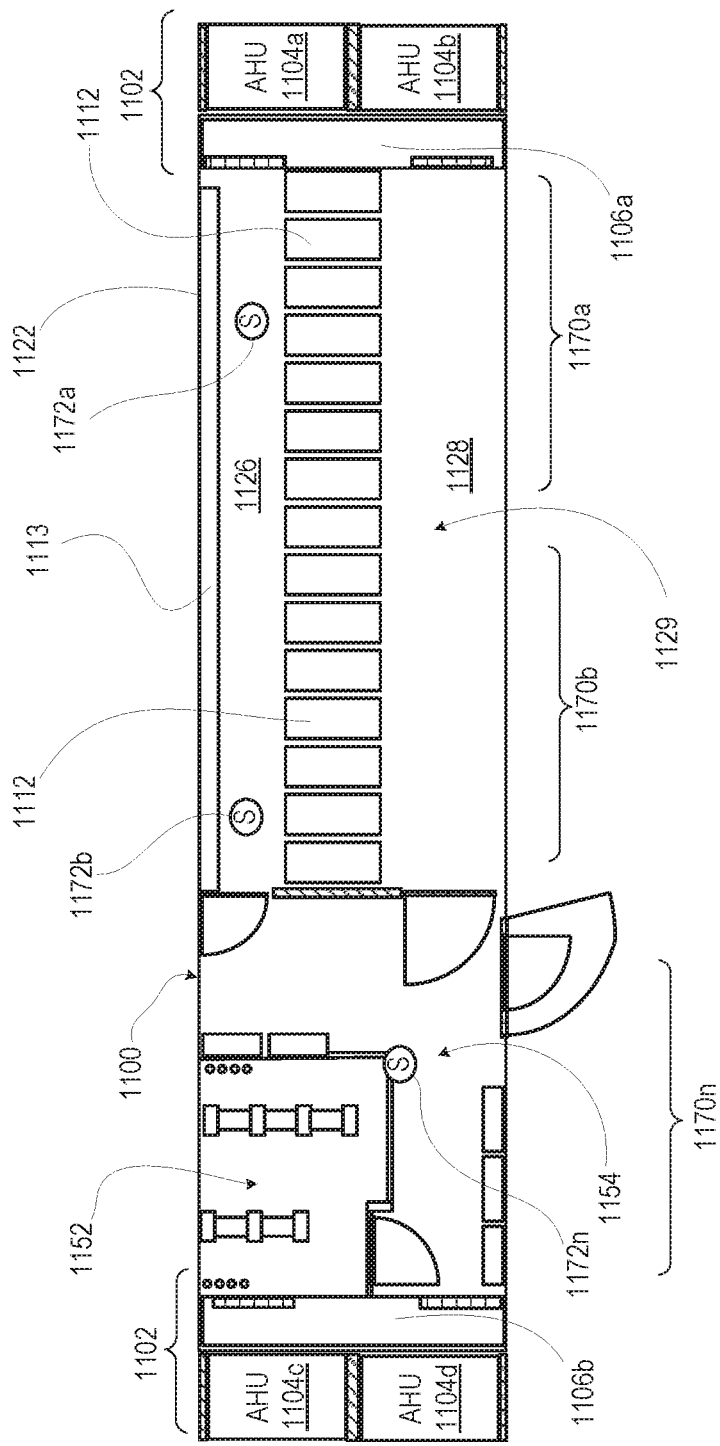
FIG. 11 is a top view of an example MDC having two forward-mounted and two aft-mounted AHUs, an IT compartment, and an equipment compartment, according to one or more embodiments.

FIG. 11 depicts example MEDC 1100 having two dual-AHU air handling systems providing cooling from opposite ends of the MEDC to each of multiple compartments within MEDC 1100. For simplicity, the complete configuration is referred to herein as a "quad-AHU air handling system" to distinguish from the dual-AHU air handling system. As shown, MEDC 1100 includes IT compartment 1129, meet-me compartment 1152, and utility room 1154. IT compartment 1129 includes a longitudinal row of IT components 1112 between cold and hot aisles 1126, 1128. Quad-AHU air handling system 1102 of MEDC 1100 includes two forward-mounted left and right AHUs 1104a, 1104b and two aft-mounted left and right AHUs 1104c, 1104d. Front AHUs 1104a, 1104b exchange cooling air via front air redirection structure 1106a with cold and hot aisles 1126, 1128. Aft AHUs 1104c, 1104d exchange cooling air via aft air redirection structure 1106b directly with meet me compartment 1152, and utility room 1154 and indirectly with cold and hot aisles 1126, 1128. Cooling requirements can be provided by selective activation and rate of cooling set for each AHU 1104a-1104d for two or more zones of multiple cooling zones 1170a, 1170b, . . . 1170n of the entire enclosure of MDC 100.

Figure 12:
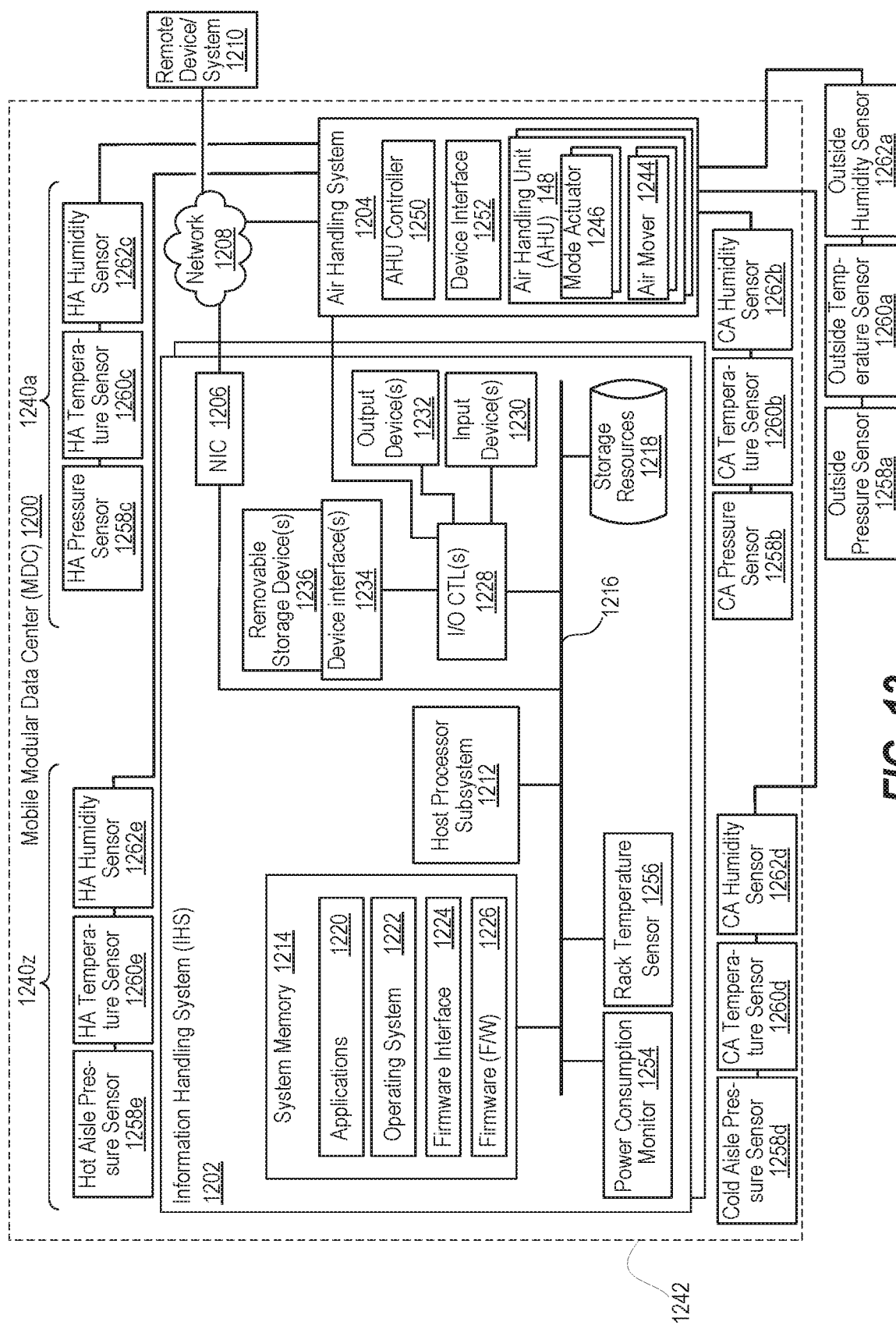
FIG. 12 is a simplified functional block diagram illustrating an MDC having information handling systems (IHSs) with environmental sensors used to control AHUs within an air handling system, according to one or more embodiments.

According to one aspect, quad-AHU air handling system 1102 determines cooling requirements based on environmental sensors 1172a, 1172b, . . . 1172n in respective zones 1170a, 1170b, . . . 1170n. FIG. 12 is a simplified functional block diagram of MDC 1200 having IT components such as information handling systems (IHSs) 1202 with environmental sensors used to control AHUs 1248 within air handling system 1204. Air handling system 1204 can be dual-AHU or quad-AHU air handling systems or other numbers and arrangements of AHUs 1248. Within the general context of IHSs, IHS 1202 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 1202 may be a personal digital assistant (PDA), a consumer electronic device, a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components. In one or more embodiments, IHS 1202 is a rack-mounted to provide computing, communication and storage functionality in mobile MDC 1200.

IHS 1202 includes a network interface, depicted as network interface controller (NIC) 1206, in communication via network 1208 for receiving IHS updates and work requests from remote devices and systems 1210. NIC 1206 enables IHS 1202 and/or components within IHS 1202 to communicate and/or interface with other devices, services, and components that are located external to IHS 1202. These devices, services, and components can interface with IHS 1202 via an external network, such as network 1208, using one or more communication protocols that include transport control protocol (TCP/IP) and network block device (NBD) protocol. Network 1208 can be a local area network, wide area network, personal area network, and the like, and the connection to and/or between network 1208 and IHS 1202 can be wired, wireless, or a combination thereof. For purposes of discussion, network 1208 is indicated as a single collective component for simplicity. However, it should be appreciated that network 1208 can comprise one or more direct connections to other devices as well as a more complex set of interconnections as can exist within a local area network or a wide area network, such as the Internet.

A host processor subsystem 1212 is coupled to system memory 1214 via system interconnect 1216. System interconnect 1216 can be interchangeably referred to as a system bus, in one or more embodiments. System interconnect 1216 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 1216 can also be a Double Data Rate (DDR) memory interface. The system memory 1214 can either be contained on separate, removable dual inline memory module (RDIMM) devices or system memory 1214 can be contained within persistent memory devices (NVDIMMs). For example, the NVDIMM-N variety of NVDIMMs contain both random access memory, which can serve as system memory 1214, and non-volatile memory. It should be noted that other channels of communication can be contained within system interconnect 1216, including but not limited to i2c or system management bus (SMBus). System interconnect 1216 communicatively couples various system components. Examples of system components include replaceable local storage resources 1218 such as solid state drives (SDDs) and hard disk drives (HDDs). Software and/or firmware modules and one or more sets of data that can be stored on local storage resources 1218 and be utilized during operations of IHS 1202. Specifically, in one embodiment, system memory 1214 can include therein a plurality of such modules, including one or more of application(s) 1220, operating system (OS) 1222, a firmware interface 1224 such as basic input/output system (BIOS) or Uniform Extensible Firmware Interface (UEFI), and platform firmware (FW) 1226. These software and/or firmware modules have varying functionality when their corresponding program code is executed by host processor subsystem 1212 or secondary processing devices within IHS 1200. For example, application(s) 1220 may include a word processing application, a presentation application, and a management station application, among other applications.

IHS 1202 further includes one or more input/output (I/O) controllers 1228 that support connection by and processing of signals from one or more connected input device/s 1230, such as a keyboard, mouse, touch screen, or microphone. I/O controllers 1228 also support connection to and forwarding of output signals to one or more connected output devices 1232, such as a monitor or display device or audio speaker(s). Additionally, in one or more embodiments, one or more device interfaces 1234, such as an optical reader, a universal serial bus (USB), a card reader, Personal Computer Memory Card International Association (PCMCIA) slot, and/or a high-definition multimedia interface (HDMI), can be associated with IHS 1202. Device interface(s) 1234 can be utilized to enable data to be read from or stored to corresponding removable storage device/s 1236, such as a compact disk (CD), digital video disk (DVD), flash drive, or flash memory card. In one or more embodiments, device interface(s) 1234 can further include general purpose I/O interfaces such as inter-integrated circuit ($I^2C$), system management bus (SMB), and peripheral component interconnect (PCI) buses.

Air handling system 1204 provides cooling air to meet the cooling requirements of IHSs 1202 in two or more zones 1240a, 1240z defined within enclosure 1242 of MDC 1200. Air movers 1244 and mode actuators 1246 of AHUs 1248 of air handling system 1204 are controlled by AHU controller 1250. AHU controller 1250 can include some or all of the components and functionality described above for IHS 1202. In one or more embodiments, IHSs 1202 can communicate cooling requirements to AHU controller 1250, via device interface 1252 or network 1208, based on values provided by power consumption monitor 1254 and rack temperature sensor 1256. In one or more embodiments, AHU controller 1250 can determine cooling requirements based in part on outside environmental sensors, depicted as outside pressure sensor 1258a, outside temperature sensor 1260a, and outside temperature sensor 1262a. In one or more embodiments, AHU controller 1250 can determine cooling requirements for first zone 1240a based in part on cold aisle (CA) environmental sensors in first zone 1240a, depicted as CA pressure sensor 1258b, CA temperature sensor 1260b, and CA temperature sensor 1262b. In one or more embodiments, AHU controller 1250 can determine cooling requirements for first zone 1240a based in part on hot aisle (HA) environmental sensors in first zone 1240a, depicted as HA pressure sensor 1258c, HA temperature sensor 1260c, and HA temperature sensor 1262c.

In one or more embodiments, AHU controller 1250 can determine cooling requirements for second zone 1240z based in part on CA environmental sensors in second zone 1240z, depicted as CA pressure sensor 1258d, CA temperature sensor 1260d, and CA temperature sensor 1262d. In one or more embodiments, AHU controller 1250 can determine cooling requirements for second zone 1240z based in part on HA environmental sensors in second zone 1240z, depicted as HA pressure sensor 1258e, HA temperature sensor 1260e, and HA temperature sensor 1262e.

Figure 13:
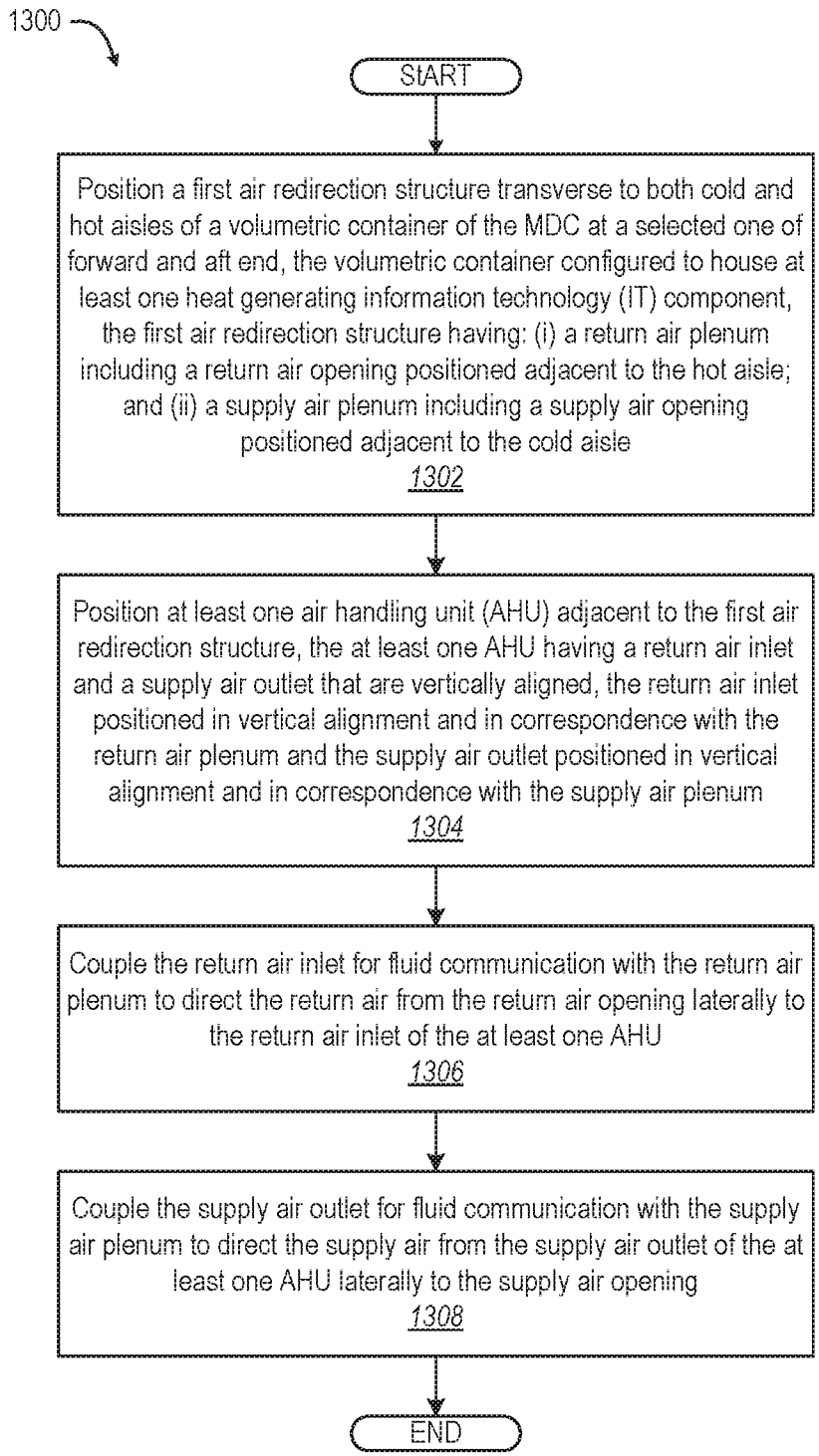
FIG. 13 is a flow diagram for a method for installing an air handling system of a mobile MDC having IT components placed between a cold aisle and a hot aisle extending longitudinally within the MDC, according to one or more embodiments.

FIG. 13 depicts a flow diagram of method 1300 for installing, by an automated manufacturing system, an air handling system of a mobile MDC having IT components placed between a cold aisle and a hot aisle extending longitudinally within the MDC. The automated manufacturing system can be controlled by an information handling system, such as IHS 1202 of FIG. 12. In one or more embodiments, method 1300 includes positioning a first air redirection structure transverse to both cold and hot aisles of a volumetric container of the MDC at a selected one of the forward and aft end of the volumetric container (block 1302). The first air redirection structure has: (i) a return air plenum including a return air opening positioned adjacent to the hot aisle; and (ii) a supply air plenum including a supply air opening positioned adjacent to the cold aisle. Method 1300 includes positioning at least one air handling unit (AHU) adjacent to the first air redirection structure. The at least one AHU has a return air inlet and a supply air outlet that are vertically spaced. The return air inlet is positioned in vertical alignment and in correspondence with the return air plenum. The supply air outlet is positioned in vertical alignment and in correspondence with the supply air plenum (block 1304). Method 1300 includes coupling the return air inlet for fluid communication with the return air plenum to direct the return air from the return air opening laterally to the return air inlet of the at least one AHU (block 1306). Method 1300 includes coupling the supply air outlet for fluid communication with the supply air plenum to direct the supply air from the supply air outlet of the at least one AHU laterally to the supply air opening (block 1308). Then method 1300 ends.

Figure 14A:
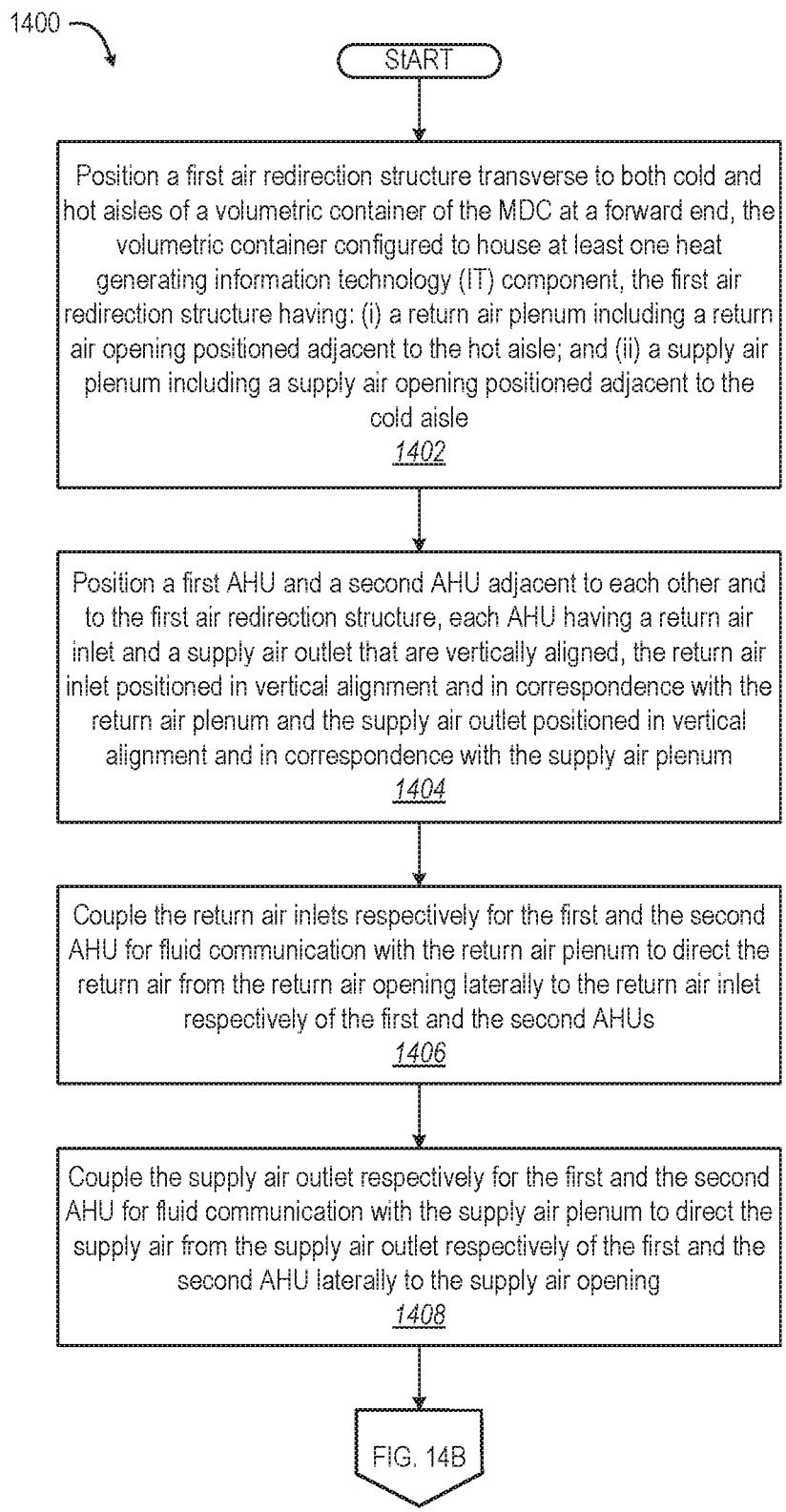
FIGS. 14A-14B are a flow diagram of a method for installing a quad air handling system of a MDC having IT components placed between a cold aisle and a hot aisle extending longitudinally within the MDC.
Figure 14B:
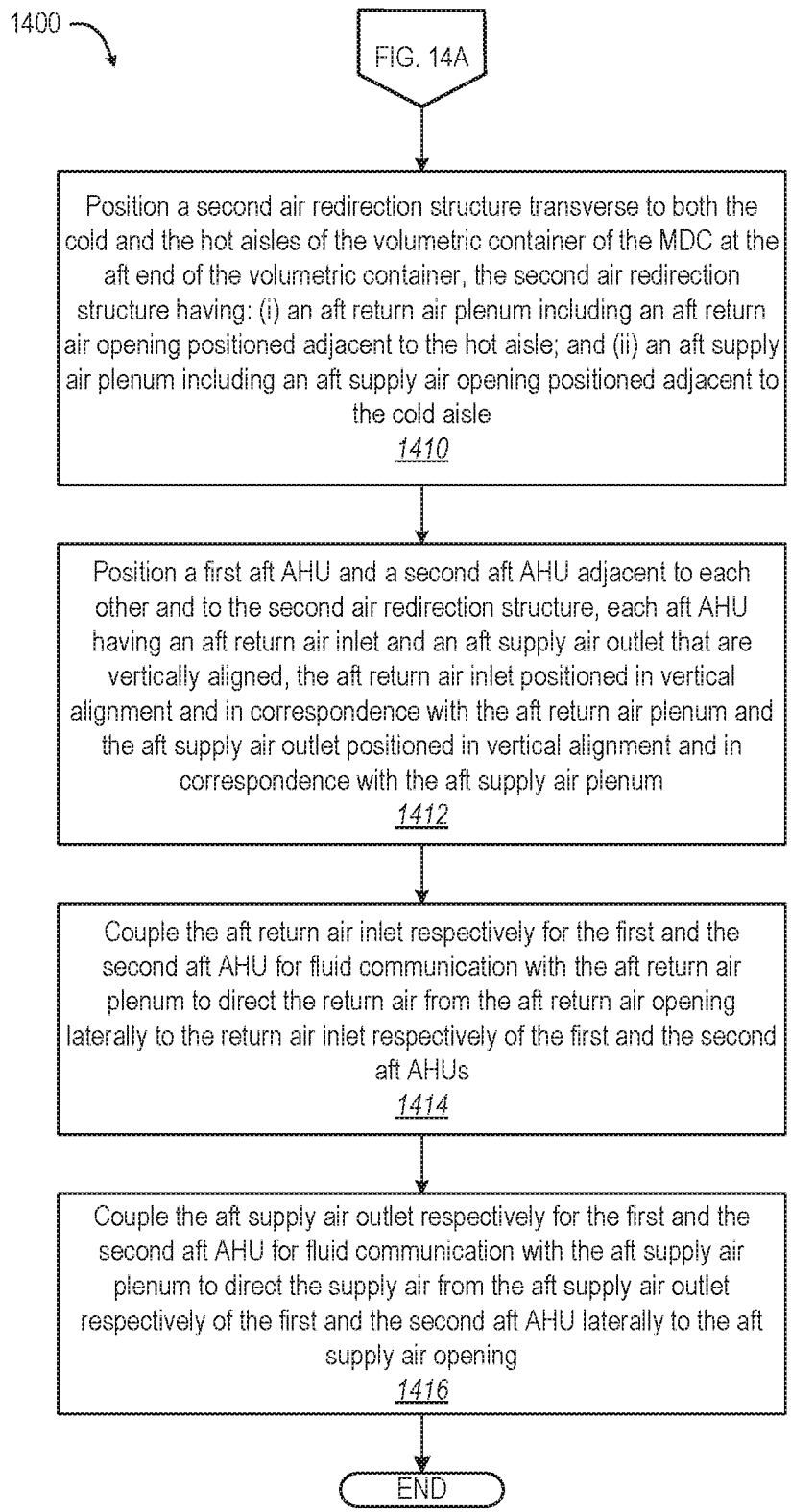

FIGS. 14A-14B depicts a flow diagram of method 1400 for installing, by an automated manufacturing system, quad-AHU air handling system 1102 of MDC 1100 (FIG. 11). The automated manufacturing system can be controlled by an information handling system, such as IHS 1202 of FIG. 12. With initial reference to FIG. 14A, method 1400 includes positioning a first dual-AHU air redirection structure transverse to both cold and hot aisles of a volumetric container of the MDC at a forward end of the volumetric container (block 1402). The first air redirection structure has: (i) a return air plenum including a return air opening positioned adjacent to the hot aisle; and (ii) a supply air plenum including a supply air opening positioned adjacent to the cold aisle. Method 1400 includes positioning a first AHU and a second AHU adjacent to each other and to the first air redirection structure. Each AHU has a return air inlet and a supply air outlet that are vertically spaced. The return air inlet is positioned in vertical alignment and in correspondence with the return air plenum. The supply air outlet is positioned in vertical alignment and in correspondence with the supply air plenum (block 1404). Method 1400 includes respectively coupling the return air inlets for the first and the second AHU with the return air plenum to direct the return air from the return air opening laterally to the return air inlet of the first and the second AHUs, respectively (block 1406). Method 1400 includes respectively coupling the supply air outlet of the first and the second AHU with the supply air plenum to direct the supply air from the supply air outlet of the first and the second AHU, respectively, laterally to the supply air opening (block 1408).

Continuing with FIG. 14B, method 1400 includes positioning a second dual-AHU air redirection structure transverse to both the cold and the hot aisles of the volumetric container of the MDC at the aft end of the volumetric container (block 1410). The second air redirection structure has: (i) an aft return air plenum including an aft return air opening positioned adjacent to the hot aisle; and (ii) an aft supply air plenum including an aft supply air opening positioned adjacent to the cold aisle. Method 1400 includes positioning a first aft AHU and a second aft AHU adjacent to each other and to the second air redirection structure. Each aft AHU has an aft return air inlet and an aft supply air outlet that are vertically spaced. The aft return air inlet is positioned in vertical alignment and in correspondence with the aft return air plenum. The aft supply air outlet is positioned in vertical alignment and in correspondence with the aft supply air plenum (block 1412). Method 1400 includes coupling the aft return air inlet respectively for the first and the second aft AHU for fluid communication with the aft return air plenum. The aft return air plenum directs the return air from the aft return air opening laterally to the return air inlet, respectively, of the first and the second aft AHUs (block 1414). Method 1400 includes respectively coupling the aft supply air outlet for the first and the second aft AHU for fluid communication with the aft supply air plenum. The aft supply air plenum directs the supply air from the aft supply air outlet, of the first and the second aft AHU, respectively, laterally to the aft supply air opening (block 1416). Then method 1400 ends.

Figure 15:
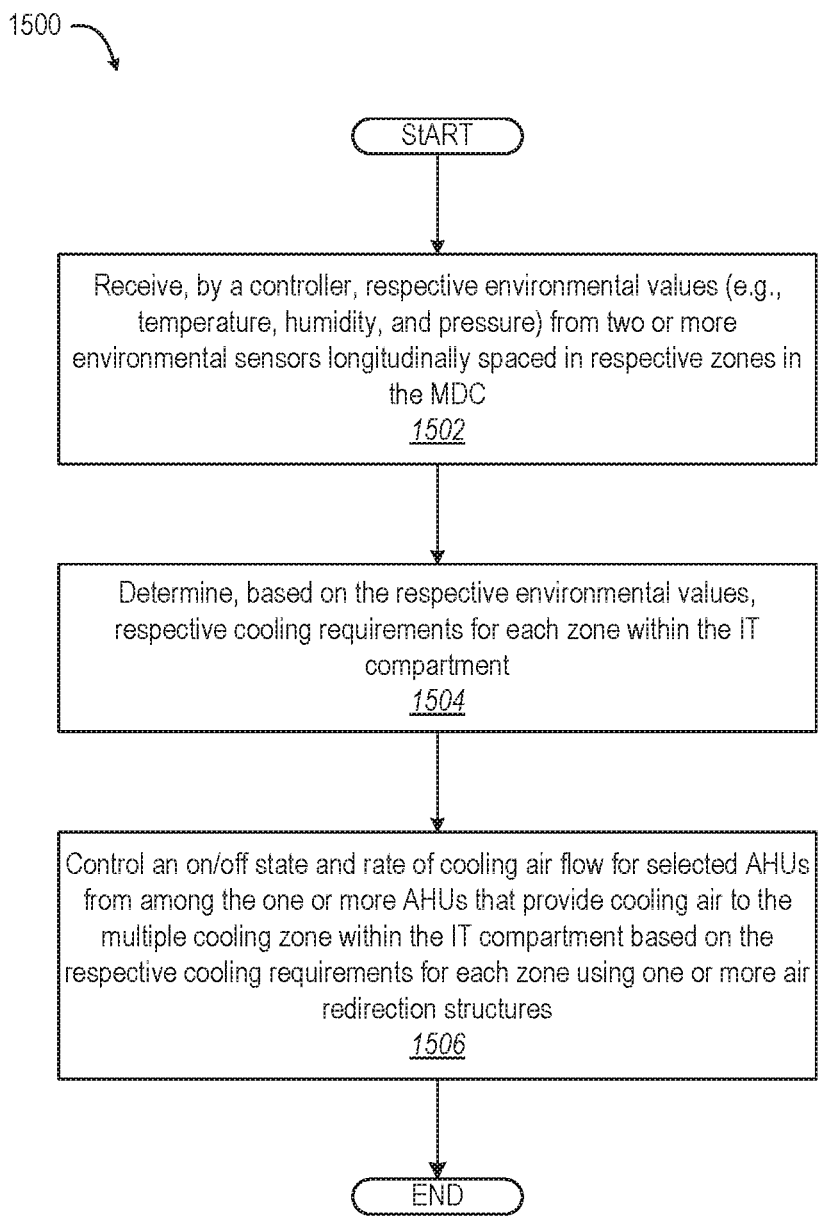
FIG. 15 is a flow diagram of a method for providing a supply of cooling airflow to heat generating IT components placed between a cold aisle and a hot aisle extending longitudinally within a mobile MDC that has both forward-mounted and aft-mounted AHUs coupled to respective air redirection structures, according to one embodiment.

FIG. 15 depicts a flow diagram of method 1500 for providing a supply of cooling airflow to components, including heat-generating IT components, within a mobile MDC. The IT components are placed between a cold aisle and a hot aisle extending longitudinally within the MDC. Method 1500 is performed by air handling system 1204 that is controlled by air handling system controller 1250 of FIG. 12. In one or more embodiments, method 1500 includes receiving respective environmental values (e.g., temperature, humidity, and pressure) from two or more environmental sensors, longitudinally spaced in respective zones in the MDC (block 1502). The controller determines, based on the respective environmental values, respective cooling requirements for each of multiple zones within the IT compartment (block 1504). The method includes controlling an on/off state and rate of cooling air flow for selected AHUs from among the AHUs. The one or more aft AHUs provide cooling air, using one or more air redirection structures, to the multiple cooling zones within the IT compartment based on the respective cooling requirements for each zone (block 1506).

In the above described flow charts of FIGS. 13-15 one or more of the methods may be embodied in air handling system controller 1250 (FIG. 12) that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made, and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An air handling system comprising:
   at least one air handling unit (AHU) having a return air inlet and a supply air outlet that are vertically spaced; and
   a first air redirection structure comprising:
      a return air plenum that is in fluid communication with and vertically aligned to the return air inlet of the at least one AHU, the return air plenum directing return air from a return air opening of the first air redirection structure to the return air inlet of the at least one AHU, the return air opening positioned adjacent to a hot aisle of a volumetric container configured to house at least one heat generating information technology (IT) component;
      a supply air plenum that is in fluid communication with and vertically aligned to the supply air outlet of the at least one AHU, the supply air plenum directing supply air from the at least one AHU to a supply air opening of the first air redirection structure, the supply air opening positioned to provide supply air to a cold aisle of the volumetric container;
      a first vertical panel that comprises respective openings that align with the return air inlet and supply air outlet of each of the at least one AHU;
      a second vertical panel that comprises the return air opening and the supply air opening; and
      a horizontal partition attached between the first and second vertical panels separating the return air plenum from the supply air plenum.

2. The air handling system of claim 1, wherein:
   the volumetric container comprises an enclosure having a forward end and an aft end with respective forward and aft exterior walls that are connected by lateral exterior walls to form an IT enclosure, with the at least one heat generating IT component positioned longitudinally between the cold and the hot aisles, which run longitudinally along respective left and right interior sides of the lateral exterior walls.

3. The air handling system of claim 2, wherein the at least one AHU is positioned adjacent to the forward exterior wall of the volumetric container, the air handling system further comprising:
   at least one aft AHU positioned adjacent to the aft exterior wall of the volumetric container, the at least one aft AHU having a return air inlet and a supply air outlet that are vertically spaced; and
   a second air redirection structure comprising a return air plenum and a supply air plenum that are in fluid communication with and vertically aligned and in correspondence respectively to the return air inlet and the supply air outlet of the at least one aft AHU, the return air plenum comprising a return air opening positioned to receive return air from the aft end of the hot aisle, and the supply air plenum comprising a supply air opening positioned to provide supply air to the aft end of the cold aisle.

4. The air handling system of claim 3, wherein:
   the at least one AHU comprises a first AHU and a second AHU positioned adjacent to the first AHU; and
   the at least one aft AHU comprises a first aft AHU and a second aft AHU positioned adjacent to the first aft AHU.

5. The air handling system of claim 3, further comprising:
   two or more environmental sensors longitudinally spaced in respective zones within an IT compartment of the volumetric container; and
   an air handling controller communicatively coupled to one or more air movers of each AHU and to the two or more environmental sensors, the air handling controller executing an air handling application that enables the air handling system to:
      receive respective environmental values from the two or more environmental sensors;
      determine, based on the respective environmental values, respective cooling requirements for each zone of multiple cooling zones within the IT compartment; and
      control an on/off state and rate of cooling air flow for selected AHUs from among the one or more AHUs and the one or more aft AHUs to provide cooling air to the multiple cooling zone within the IT compartment based on the respective cooling requirements for each zone.

6. The air handling system of claim 5, wherein:
   the at least one AHU comprises a first AHU and a second AHU positioned adjacent to the first AHU;
   the at least one aft AHU comprises a first aft AHU and a second aft AHU positioned adjacent to the first aft AHU; and
   the air handling controller enables the air handling system to control the on/off state and the rate of cooling air flow for the selected AHUs of the first and the second AHUs and the first and the second aft AHUs to support the respective cooling requirements for each zone.

7. The air handling system of claim 1, wherein:
   the return air inlet is not in alignment with the return air opening; and
   the return air plenum laterally directs return air from the return air opening to the return air inlet of each of the at least one AHU.

8. The air handling system of claim 1, wherein:
   the supply air outlet is not in alignment with the supply air opening; and
   the supply air plenum laterally directs supply air from the supply air outlet of each of the at least one AHU to the supply air opening.

9. The air handling system of claim 1, wherein:
   the at least one AHU comprises a first AHU positioned external to the volumetric container and mechanically coupled to an outer surface of a first exterior wall of the volumetric container; and
   the first exterior wall comprises top and bottom openings that each align respectively with the return air inlet and the supply air outlet to enable transfers of respective hot air and cold air with an interior of the volumetric container.

10. The air handling system of claim 9, wherein:
    the at least one AHU comprises a second AHU positioned adjacent to the first AHU, external to the first exterior wall of the volumetric container; and
    the first exterior wall comprises second top and bottom openings that align respectively with the return air inlet and the supply air outlet of the second AHU to enable transfers of a portion of respective hot air and cold air with the interior of the volumetric container.

11. A modular data center (MDC) comprising:
    a volumetric container comprising an enclosure having first and second exterior walls at a forward and an aft end, connected by lateral exterior walls;
    at least one heat generating information technology (IT) component positioned longitudinally within the volumetric container and between a cold aisle and a hot aisle running longitudinally along respective left and right interior sides of the volumetric container; and an air handling system comprising:
- at least one air handling unit (AHU) having a return air inlet and a supply air outlet that are vertically spaced; and
- a first air redirection structure comprising:
  - a return air plenum that is in fluid communication with and vertically aligned to the return air inlet of the at least one AHU, the return air plenum directing return air from a return air opening of the first air redirection structure to the return air inlet of the at least one AHU, the return air opening positioned adjacent to hot aisle of the volumetric container;
  - a supply air plenum that is in fluid communication with and vertically aligned to the supply air outlet of the at least one AHU, the supply air plenum directing supply air from the at least one AHU to a supply air opening of the first air redirection structure, the supply air opening positioned to provide supply air to the cold aisle of the volumetric container;
  - a first vertical panel that comprises respective openings that align with the return air inlet and supply air outlet of each of the at least one AHU;
  - a second vertical panel that comprises the return air opening and the supply air opening; and
  - a horizontal partition attached between the first and second vertical panels separating the return air plenum from the supply air plenum.

12. The MDC of claim 11, wherein the at least one AHU is positioned adjacent to the forward exterior wall of the volumetric container, the air handling system further comprising:
- at least one aft AHU positioned adjacent to the aft exterior wall of the volumetric container, the at least one aft AHU having a return air inlet and a supply air outlet that are vertically spaced;
- a second air redirection structure comprising a return air plenum and a supply air plenum that are in fluid communication with and vertically aligned and in correspondence respectively to the return air inlet and the supply air outlet of the at least one aft AHU, the return air plenum comprising a return air opening positioned to receive return air from the aft end of the hot aisle, and the supply air plenum comprising a supply air opening positioned to provide supply air to the aft end of the cold aisle;
- two or more environmental sensors longitudinally spaced in respective zones within an IT compartment of the volumetric container; and
- an air handling controller communicatively coupled to the one or more air movers of each AHU and to the two or more environmental sensors, the air handling controller executing an air handling application that enables the air handling system to:
  - receive respective environmental values from the two or more environmental sensors;
  - determine, based on the respective environmental values, respective cooling requirements for each zone within the IT compartment;
  - select AHUs from among the one or more AHUs and the one or more aft AHUs to provide cooling air to the zones within the IT compartment based on the respective cooling requirements; and
  - control an on/off state and rate of cooling air flow for selected AHUs from among the one or more AHUs and the one or more aft AHUs to provide cooling air to the multiple cooling zone within the IT compartment based on the respective cooling requirements for each zone.

13. A method for providing a supply of cooling airflow to heat generating information technology (IT) components within a mobile modular data center (MDC), the IT components placed between a cold aisle and a hot aisle extending longitudinally within the MDC, the method comprising:
- receiving respective environmental values from two or more environmental sensors longitudinally spaced in respective zones in the MDC, the MDC having one or more forward air handling units (AHUs) and one or more aft AHUs;
- determining, based on the respective environmental values, respective cooling requirements for each zone within the IT compartment; and
- controlling an on/off state and rate of cooling air flow for selected AHUs from among the one or more forward AHUs and the one or more aft AHUs to provide cooling air to the respective cooling zones within the IT compartment based on the respective cooling requirements determined for each zone.

14. The method of claim 13, further comprising directing air exchange with the IT compartment from each AHU using one or more air redirection structures, each AHU having a return air inlet and a supply air outlet that are vertically spaced with the IT compartment, each air redirection structures comprising: (i) a return air plenum that is in fluid communication with and vertically aligned to the return air inlet of the at least one AHU, the return air plenum directing return air from a return air opening of the first air redirection structure to the return air inlet of the at least one AHU, the return air opening positioned adjacent to a selected one of the forward and the aft end of the hot aisle of the volumetric container; and (ii) a supply air plenum that is in fluid communication with and vertically aligned to the supply air outlet of the at least one AHU, the supply air plenum directing supply air from the at least one AHU to a supply air opening of the first air redirection structure, the supply air opening positioned at a same one of the forward and the aft end to provide supply air to the cold aisle of the volumetric container.

15. The method of claim 13, wherein selecting AHUs comprises selecting AHUs from among: (i) first and second AHUs of the one or more AHUs at the forward ends of the hot and the cold aisles; and (ii) first and second aft AHUs of the one or more aft AHUs at the aft ends of the hot and the cold aisles to provide cooling air to the zones within the IT compartment based on the respective cooling requirements.

16. A method for installing an air handling system of a mobile modular data center (MDC) having information technology (IT) components placed between a cold aisle and a hot aisle extending longitudinally within the MDC, the method comprising:
- positioning a first air redirection structure transverse to both cold and hot aisles of a volumetric container of the MDC at a selected one of forward and aft end, the volumetric container configured to house at least one heat generating information technology (IT) component, the first air redirection structure having: (i) a return air plenum including a return air opening positioned adjacent to the hot aisle; (ii) a supply air plenum including a supply air opening positioned adjacent to the cold aisle; (iii) a first vertical panel that comprises respective openings that align with the return air inlet and supply air outlet of each of at least one air handling unit (AHU); (iv) a second vertical panel that comprises the return air opening and the supply air opening; and (v) a horizontal partition attached between the first and second vertical panels separating the return air plenum from the supply air plenum positioning the at least one AHU adjacent to the first air redirection structure, the at least one AHU having a return air inlet and a supply air outlet that are vertically spaced, the return air inlet positioned in vertical alignment and in correspondence with the return air plenum and the supply air outlet positioned in vertical alignment and in correspondence with the supply air plenum;

coupling the return air inlet for fluid communication with the return air plenum to direct the return air from the return air opening laterally to the return air inlet of the at least one AHU; and coupling the supply air outlet for fluid communication with the supply air plenum to direct the supply air from the supply air outlet of the at least one AHU laterally to the supply air opening.

17. The method of claim 16, wherein positioning the at least one AHU comprises:
positioning a first AHU and a second AHU adjacent to each other and to the first air redirection structure;
coupling the return air inlet respectively for the first and the second AHU for fluid communication with the return air plenum to direct the return air from the return air opening laterally to the return air inlet respectively of the first and the second AHUs; and
coupling the supply air outlet respectively for the first and the second AHU for fluid communication with the supply air plenum to direct the supply air from the supply air outlet respectively of the first and the second AHU laterally to the supply air opening.

18. The method of claim 16, further comprising:
positioning the first air redirection structure at the forward end of the volumetric container;
positioning a second air redirection structure transverse to both the cold and the hot aisles of the volumetric container of the MDC at the aft end of the volumetric container, the second air redirection structure having: (i) an aft return air plenum including an aft return air opening positioned adjacent to the hot aisle; and (ii) an aft supply air plenum including an aft supply air opening positioned adjacent to the cold aisle;
positioning at least one aft AHU adjacent to the second air redirection structure, the at least one aft AHU having an aft return air inlet and an aft supply air outlet that are vertically spaced, the aft return air inlet positioned in vertical alignment and in correspondence with the aft return air plenum and the aft supply air outlet positioned in vertical alignment and in correspondence with the aft supply air plenum;
coupling the aft return air inlet off the at least one aft AHU for fluid communication with the aft return air plenum to direct the return air from the aft return air opening laterally to the aft return air inlet of the at least one aft AHU; and
coupling the aft supply air outlet for fluid communication with the aft supply air plenum to direct the supply air from the aft supply air outlet of the at least one aft AHU laterally to the aft supply air opening.

19. The method of claim 18, wherein positioning the at least one AHU comprises:
positioning a first aft AHU and a second aft AHU adjacent to each other and to the second air redirection structure;
coupling the aft return air inlet respectively for the first and the second aft AHU for fluid communication with the aft return air plenum to direct the return air from the aft return air opening laterally to the return air inlet respectively of the first and the second aft AHUs; and
coupling the aft supply air outlet respectively for the first and the second aft AHU for fluid communication with the aft supply air plenum to direct the supply air from the aft supply air outlet respectively of the first and the second aft AHU laterally to the aft supply air opening.

\* \* \* \* \*